United States Patent [19]
Lin

[11] Patent Number: 6,077,309
[45] Date of Patent: Jun. 20, 2000

[54] METHOD AND APPARATUS FOR LOCATING COORDINATED STARTING POINTS FOR ROUTING A DIFFERENTIAL PAIR OF TRACES

[75] Inventor: Kuoching Lin, Beaverton, Oreg.

[73] Assignee: Mentor Graphics Corporation, Wilsonville, Oreg.

[21] Appl. No.: 09/004,107

[22] Filed: Jan. 7, 1998

[51] Int. Cl.[7] .................................................. G06F 15/60
[52] U.S. Cl. ............................................................ 716/14
[58] Field of Search ........................... 364/491; 361/782; 716/14

[56] References Cited

U.S. PATENT DOCUMENTS 4,484,292  11/1984  Hong ......................................... 716/13
5,375,069  12/1994  Satoh ......................................... 716/14
5,629,838   5/1997  Knight ...................................... 361/782

Primary Examiner—Paul R. Lintz
Assistant Examiner—Thuan Do
Attorney, Agent, or Firm—Blakely Sokoloff Taylor & Zafman, LLP

[57] ABSTRACT

In accordance with the teachings of the present invention, an improved method and apparatus for automatically locating the coordinated starting points of a differential pair is provided. In one embodiment, a profile of obstacles is constructed, wherein the obstacles are proximately situated adjacent to a first and second endpoint of a differential pair. A pair of coordinated starting points are determined, corresponding to the first and second endpoints, using the constructed profile. The coordinated starting points are used for routing the differential pair of traces in a coordinated manner.

27 Claims, 6 Drawing Sheets

METHOD AND APPARATUS FOR LOCATING COORDINATED STARTING POINTS FOR ROUTING A DIFFERENTIAL PAIR OF TRACES

BACKGROUND OF THE INVENTION

1. Field of the Invention

The present invention pertains to the field of electronic design automation (EDA). More particularly, this invention relates to the art of routing differential pairs.

2. Background

Technological advances have lead to increasingly complex circuitry. At the board level, circuits are routinely composed of dozens of complex very large scale integration (VLSI) components. Hundreds, or even thousands, of conductive traces may be required in one or more layers of a printed circuit board (PCB) to selectively connect the components. Each trace must meet a number of constraints, such as signal integrity as well as minimum and maximum signal delays. It would be incredibly time consuming, if not physically impossible, for a person to manually lay out all of the physical traces, and verify all of the signal constraints for today's complex electronic designs. At the chip level, integrated circuit design is moving toward even more complex circuits. Often times, an entire system is laid out on a single chip.

Even as complexity increases, market pressures require shorter design cycles. The pace of competition will not allow a designer to spend countless hours laying out a chip or PCB manually. As a result, designers are always looking for ways to streamline the design process. One simplification involves designing at a higher level of abstraction. In other words, a designer can provide a "netlist" which specifies all of the component connections. Then, given the physical dimensions and pin locations of components and the printed circuit board or chip to which the components are coupled, an automated design tool can generate a physical layout for the circuit.

High frequency circuits pose additional design difficulties. Signals that propagate over lines at high frequency are more susceptible to interference. Interference includes signal reflections at impedance changes, and cross-talk from electromagnetic fields of neighboring components and lines. One approach to high frequency signal propagation involves the use of differential pairs. A differential pair has two conductive traces which are laid out, for the most part, in parallel and in close proximity to one another. The traces can be either on the same layer or adjacent layers of a PCB or chip.

When a signal is propagated on a differential pair, the signal is equal to the difference in voltage levels on the two traces. For instance, if the threshold voltage for a logical one is 0.7 volts, one trace will provide at least positive 0.35 volts and the other trace will provide at least negative 0.35 volts. In other words, a wave form on one trace is propagated with a mirror image wave form on the other trace, and the difference between the two wave forms comprises the propagated signal.

Since the two traces are, for the most part, in close proximity to one another, any interference experienced by one trace is likely to be experienced by both traces. For instance, if one trace experiences a positive voltage spike, the other trace is likely to experience a positive voltage spike of the same magnitude. The signal is equal to the difference in the wave forms, so the difference remains constant because the spike is added to both wave forms. In short, differential pairs are much less susceptible to interference. As a result, differential pairs are particularly suitable for high frequency signal propagation.

Automated routing of differential pairs is more complex than single entity routing. For each connection, two traces must be routed in a coordinated manner. For the most part, the traces must be kept in close proximity as well as substantially parallel to one another. Of particular concern is the location of the starting points where the differential pair begins to be routed in a coordinated manner. There are two endpoints, one for each trace, at the end of a differential pair. At an end of a given differential pair, a number of obstacles may crowd around one or both endpoints. Therefore, a need exists for an improved method and apparatus for automatically locating the coordinated starting points of a differential pair.

SUMMARY OF THE INVENTION

In accordance with the teachings of the present invention, an improved method and apparatus for automatically locating the coordinated starting points of a differential pair is provided. In one embodiment, a profile of obstacles is constructed, wherein the obstacles are proximately situated adjacent to a first and second endpoint of a differential pair. A pair of coordinated starting points are determined, corresponding to the first and second endpoints, using the constructed profile. The coordinated starting points are used for routing the differential pair of traces in a coordinated manner.

BRIEF DESCRIPTION OF THE DRAWINGS

Examples of the present invention are illustrated in the accompanying drawings. The accompanying drawings, however, do not limit the scope of the present invention in any way. Like references in the drawings indicate similar elements.

DETAILED DESCRIPTION

In the following detailed description, exemplary embodiments are presented in connection with the figures and numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. Accordingly, the innovative features of the present invention may be practiced in a system of greater or lesser complexity than that of the system depicted in the figures. In other instances well known methods, procedures, components, and circuits have not been described in detail.

Figure 1A:
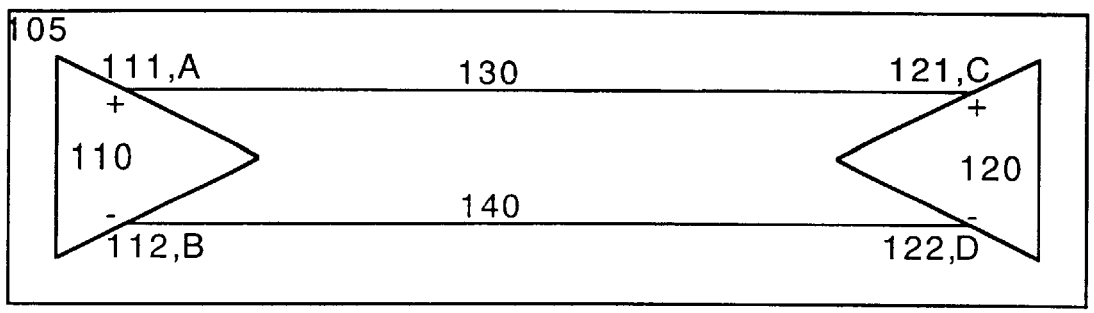
FIG. 1A is a block diagram of a differential pair connecting two components.

FIG. 1A is a block diagram of exemplary components 110 and 120 positioned on exemplary printed circuit board (PCB) 105. Alternately, components 110 and 120 could be positioned in a single chip on which, for example, an entire system is incorporated. In the illustrated embodiment, component 110 includes positive port 111 and negative port 112 connected to endpoints A and B of traces 130 and 140 respectively. Component 120 includes positive port 121 and negative port 122 connected to endpoints C and D of traces 130 and 140 respectively.

Traces 130 and 140 together comprise a differential pair. When a signal is propagated on the differential pair, traces 130 and 140 propagate mirror image wave forms. A signal propagated over the differential pair is equal to the difference between the two wave forms.

In general, signal integrity is more difficult to maintain as frequency increases. Differential pairs are less susceptible to interference than single entity transmission lines. Therefore, differential pairs are particularly useful for high frequency signal propagation.

Figure 1B:
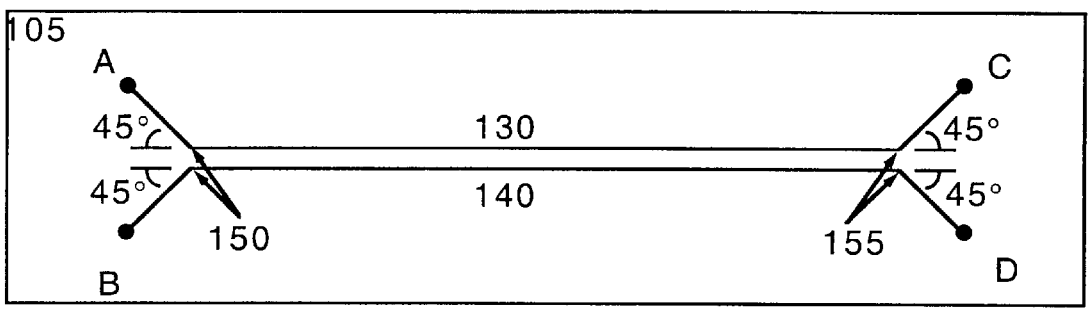
FIG. 1B is a trace layout of the differential pair from FIG. 1A.

FIG. 1B is a trace layout of the differential pair from FIG. 1A. The traces become substantially parallel, as well as proximately close to each other, at coordinated starting points 150 and 155. Once coordinated starting points are determined for respective endpoints A, B, C, and D, the differential pair can be routed between the starting points in a coordinated manner, as if, for example, the traces were a single thick trace.

When the traces are in close proximity to one another, the differential pair is immune to most interference because both traces experience substantially the same interference, as discussed above. Accordingly, coordinated starting points 150 and 155 should be positioned close to the respective endpoints A, B, C, and D so that, over the majority of the length of the traces, the traces remain substantially parallel as well as proximately close to each other.

At coordinated starting points 150 and 155, for the illustrated embodiment, the traces bend at 45 degree angles. A range of angles could have been used, although for computational expediency, 45 and 90 degree bends are preferred. Experience has shown, however, that 45 degree bends provide better electrical characteristics than 90 degree bends, especially at high frequency. For instance, a wave form can be thought of in terms of water traveling in a pipe. A reflection is created when a wave form encounters a bend. This is because bends introduce changes in impedance. Sharp bends, particularly 90 degree bends, cause large reflections. The amount of interference caused by reflections increases as frequency increases. A 45 degree bend, however, introduces much less impedance than a 90 degree bend. Therefore, where possible, 45 degree bends are preferred over 90 degree bends.

Figure 5:
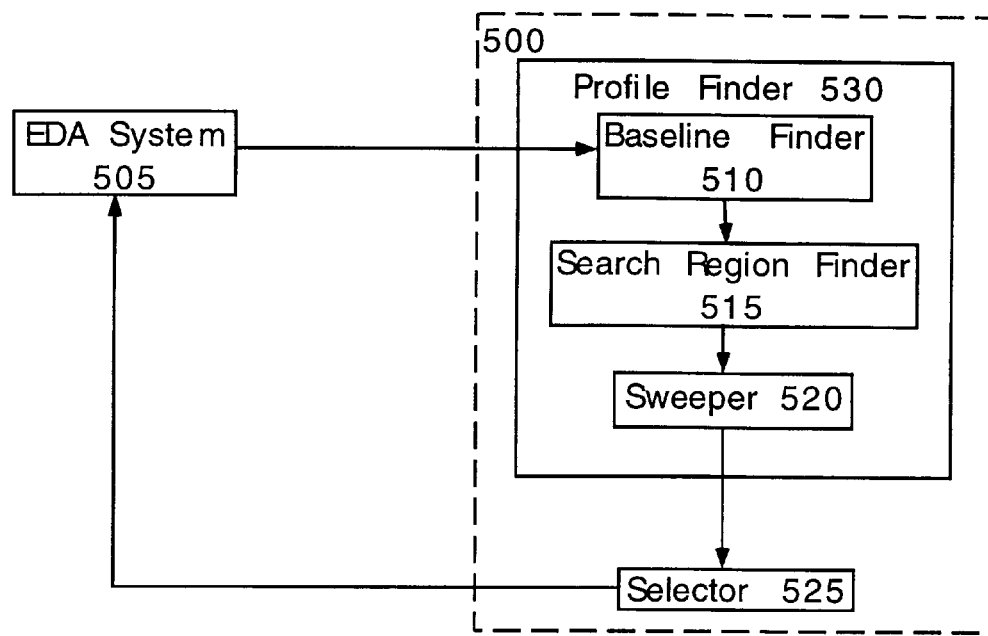
FIG. 5 is a block diagram of one embodiment of the present invention.

Skipping now to FIG. 5, a block diagram is depicted of an apparatus that locates coordinated starting points. System 500 is coupled to electronic design automation (EDA) system 505. EDA system 505 can be any of a wide range of routing tools. EDA system 505 provides data to system 500, wherein the data defines a physical circuit design in which differential pairs remain to be routed. The data could, for example, be in the form of a netlist. System 500 will use the data to select positions for coordinated starting points for one or more sets of endpoints. The selected locations are returned to EDA system 505 in the same data format. EDA system 505 can then route one or more respective differential pairs between the coordinated starting points.

Figure 2A:
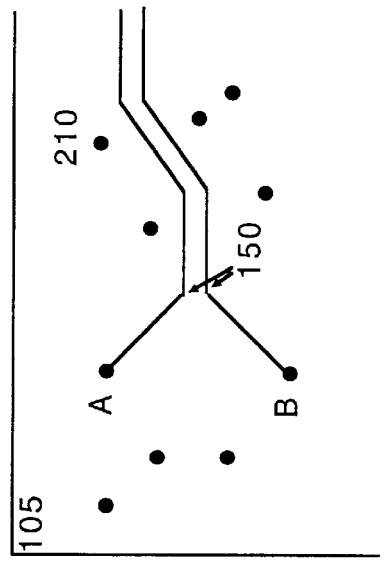
FIG. 2A is a diagram of a section of a printed circuit board including a set of endpoints, at one end of a differential pair, positioned among a number of obstacles.

Take FIG. 2A as an example. In FIG. 2A, a section of PCB 105 includes a set of endpoints A and B. A pair of coordinated starting points must be selected so that a differential pair can be connected to endpoints A and B. In the illustrated example, however, a number of obstacles 210 are located in the vicinity of endpoints A and B. System 500 will attempt to select coordinated starting points, in the vicinity of endpoints A and B, that will provide EDA system 505 with a path by which the coordinated traces can escape through the obstacles.

Figure 2B:
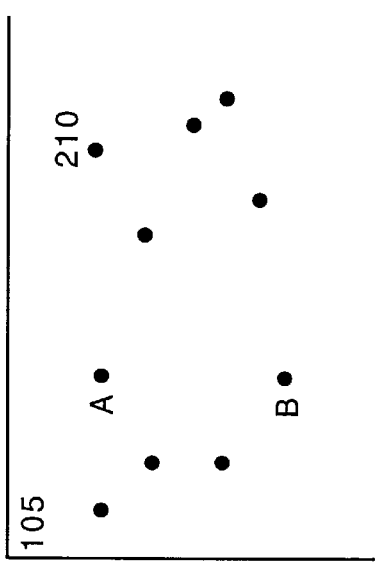
FIG. 2B is the diagram of FIG. 2A illustrating a search region.

In order to select the coordinated starting points, a profile of obstacles 210 is constructed by profile finder 530. Profile finder 530 includes baseline finder 510, search region finder 515, and sweeper 520. As shown in FIG. 2B, baseline finder 510 defines baseline 220 relative to endpoints A and B. In one embodiment, baseline 220 passes through the center of both endpoints A and B. Search region finder 515 then defines search region 230 relative to baseline 220, so that search region 230 extends from baseline 220.

Search region finder 515 can rotate baseline 220 about center point 205, which is centered between endpoints A and B. By rotating baseline 220, search region 230 can extend in a number of predetermined directions corresponding to the x-y coordinate plane of PCB 105. Endpoints A and B may also be electrically coupled to multiple layers of PCB 105. Search region finder 515, then, can define search region 230 in a number of predetermined directions on one or more of the multiple layers.

A costing analysis is used by search region finder 515 to select from among the many possible directions and layers. Search region finder 515 estimates which direction and layer would likely be most cost efficient. Generally, the most cost efficient direction and layer will be in the direction and layer of the most direct or shortest route. This is because the most direct route will likely use the least amount of conductive material and take the least amount of manufacturing time. For example, if the opposite endpoints of the differential pair are on a different layer of the PCB, a via must be used to traverse layers, as will be discussed below. Vias add cost and complexity, and are therefore generally avoided where possible. If coordinated starting points cannot be positioned in a first search region, a next least costly search region can be defined.

Once a direction and layer are selected, the dimensions of the search region can be established. Search region 230 is sufficiently wide to include endpoints A and B, including a minimum spacing requirement around each. The minimum spacing requirement is the minimum distance needed to route a trace next to an obstacle. By routing traces at least a minimum spacing requirement away from the edges of the search region, traces will not to be too close to obstacles just outside the search region.

The length of search region 230 extends away from rotated baseline 220. The overall length can vary, for instance, from iteration to iteration, design to design, and hardware platform to hardware platform. The computational complexity, and therefore the amount of time spent, increases as the search region is extended. However, the likelihood of locating positions for a pair of coordinated starting points also increases with the size of the search region. Therefore, for the first attempt, the largest search region possible should be used, given the speed of the hardware platform and the amount of time available. If acceptable positions are not located in a first attempt, the search region can be extended, or a different direction or layer can be tried.

Once search region 230 has been defined, sweeper 520 generates a profile of obstacles in the search region. An example profile is shown in FIG. 2C. A mathematical formula extracts from the data provided by EDA system 505 the coordinates of obstacles in the x-y coordinate plane of PCB 105. Then, search region 230 is swept out from baseline 220, and the locations of obstacles relative to baseline 220 are noted. The size of each obstacle is exaggerated to account for a minimum spacing requirement 240, as seen in FIG. 2B. The front surface of each obstacle, including spacing requirement 240, is approximated by a set of straight edges. The space in the profile to the left of the straight edges is empty space in which a trace can be routed.

Selector 525 attempts to select coordinated starting points within the empty space. First, the profile is divided into slices. There is one slice for each front edge of each obstacle in search region 230. Then, each slice is scanned out from baseline 220 until an edge is encountered. The space to the left of an edge is a gap, like gap 250. From the perspective of selector 525, everything beyond the edge is occupied space. The length of each gap is compared to a minimum length requirement needed for a pair of coordinated starting points. Then the width of one or more adjacent gaps, which meet the length requirement, are compared to a minimum width requirement needed for a pair of coordinated starting points. Adjacent gaps are scanned to verify that at least a minimally sized path exists from each of the pins to the respective coordinated starting points.

If a number of coordinated starting points are available, selector 525 uses a costing analysis to select a first pair. A pair of coordinated starting points located along a line extending in the direction of search region 230 from the center point between endpoints A and B is preferred over an off-center position. This is because when traces are comparable in length, the difference in signal delay is negligible. Accordingly, a center position usually minimizes the difference in trace lengths, as well as requires the lowest material cost. If a pair of central coordinated starting points are not available, however, the next closest off-center position will be used.

Selector 525 also considers the trace locations from endpoints A and B to the coordinated starting points. Traces using no bends, or only 45 degree bends, are preferred over traces requiring 90 degree bends as discussed above. Although 45 degree bends may be obtainable in any number of exit directions, central coordinated starting points that allow for 45 degree bends are preferred. In alternate embodiments, a full range of bend angles could be employed, wherein gentle bends are preferred over sharp bends.

Figure 2D:
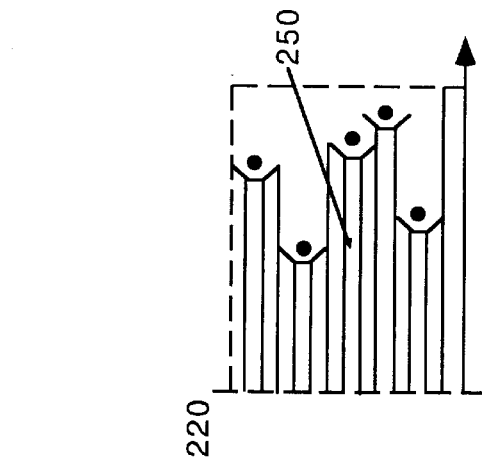
FIG. 2D is the diagram of FIG. 2A illustrating automatically positioned coordinated starting points of the differential pair.
Figure 2C:
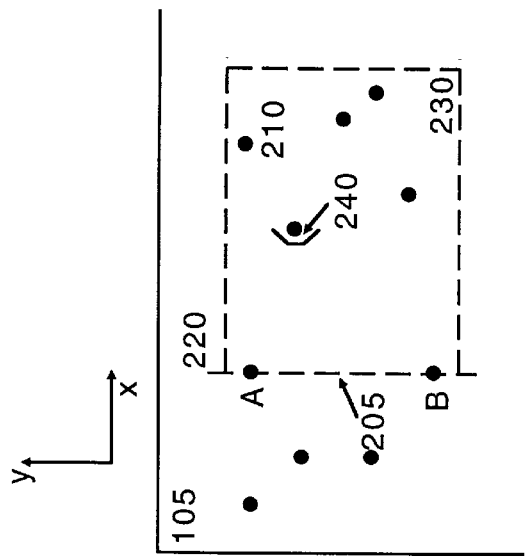
FIG. 2C is a profile of obstacles in the search region of FIG. 2B.

An example is shown in FIG. 2D. System 500 automatically selected coordinated starting points 150 because gap 250, from FIG. 2C, was larger than the minimum spacing requirement needed for coordinated starting points, and gap 250 was in a central position. Also, gap 250 was large enough to allow for the preferred 45 degree bends in the paths; from each of endpoints A and B to the respective coordinated starting points, have the preferred 45 degree bends. In the illustrated example, EDA system 505 routes the differential pair from coordinated starting points 150.

Figure 3C:
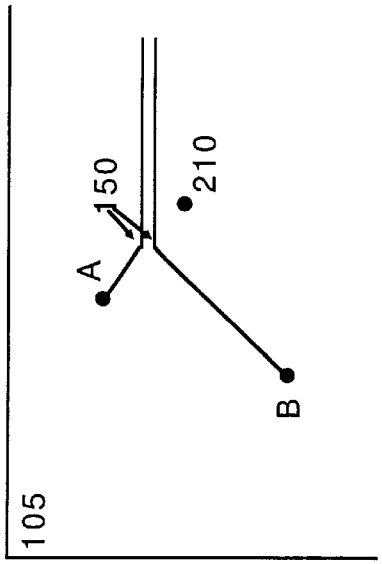
FIG. 3C is the diagram of FIG. 3A illustrating automatically positioned coordinated starting points of the differential pair which are off center.
Figure 3E:
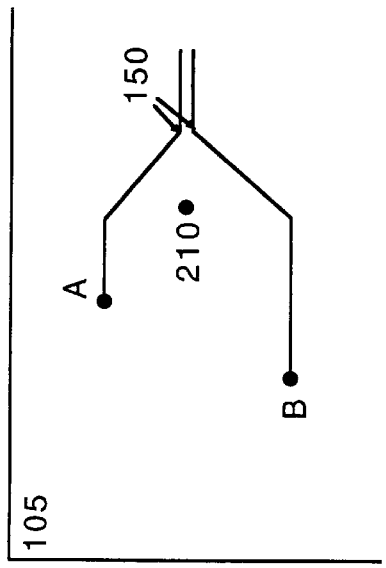
FIG. 3E is the diagram of FIG. 3A illustrating automatically positioned coordinated starting points of the differential pair which are centered in the rotated search region.
Figure 3B:
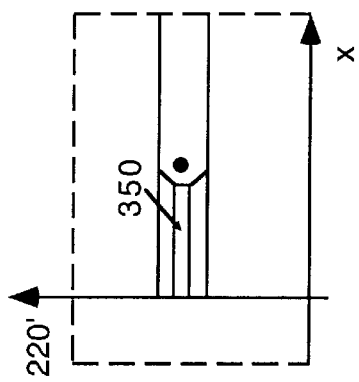
FIG. 3B is a front-side profile of an obstacle in the rotated search region of FIG. 3A.
Figure 3D:
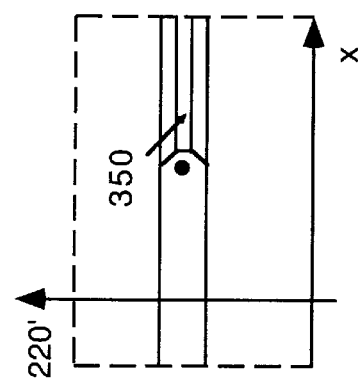
FIG. 3D is a back-side profile of an obstacle in the rotated search region of FIG. 3A.
Figure 3A:
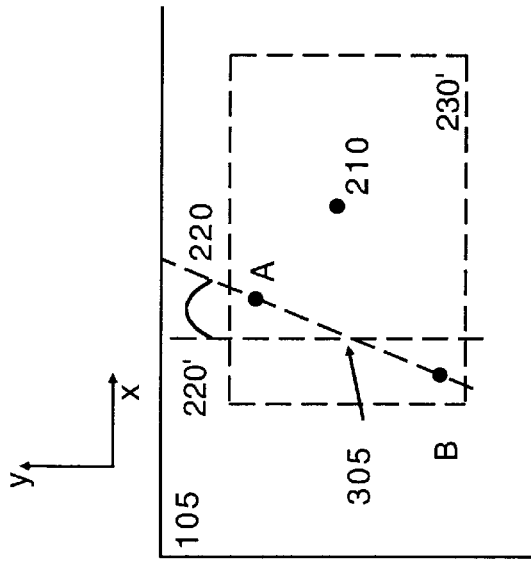
FIG. 3A is a diagram of a section of a printed circuit board including a set of endpoints at one end of a differential pair, which are not positioned in alignment with a coordinate system of the printed circuit board, and a rotated search region.

FIG. 3A is another example. In FIG. 3A, endpoints A and B are positioned on a section of PCB 105. In this example, when baseline 220 is defined through the center of endpoints A and B, baseline 220 is not aligned with the x-y coordinates of PCB 105. In one embodiment, a search region 230 could be defined relative to baseline 220 using a possibly very complex coordinate rotation. Given enough time, a pair of coordinated starting points may be located within search region 230.

In FIG. 3A, however, the routing calculations can be simplified by rotating the baseline to align with one of the eight cardinal directions in the x-y coordinate plane of PCB 105. For example, if the origin of the x-y coordinate plane of PCB 105 is shifted to center point 305, the first cardinal direction is in the positive x direction. The second cardinal direction is along x=y in the positive quadrant, and is therefore 45 degrees off of the first cardinal direction. The remaining 6 cardinal directions are each separated by 45 degrees, radiating out from center point 305. The 45 degree coordinate rotations simplify the translation of positions relative to the x-y coordinates of PCB 105 to positions relative to baseline 220.

Baseline 220' is rotated about a center point 305, between endpoints A and B, to align the baseline with the nearest of the eight cardinal directions of the x-y coordinate plane of PCB 105 as discussed above. Search region 230' is defined relative to rotated baseline 220' as discussed above for FIG. 2B. In this example, search region 230' extends out from baseline 220' on both sides so as to include endpoint B and a minimum spacing requirement around endpoint B. A front side profile of obstacle 210 is illustrated in FIG. 3B, and the profile is sliced and analyzed as discussed above. In FIG. 3C, central coordinated starting points could not be located in front of obstacle 210 because gap 350 was not larger than the minimum spacing requirement for the coordinated starting points. Instead, coordinated starting points 150 are located off center.

From the perspective of selector 525, all of the space to the right of the edge in the slice containing gap 350 is occupied space. Selector 525, therefore, missed an opportunity for a centrally located starting point on the back side of obstacle 210. In alternate embodiments, sweeper 520 could perform a back side profile by sweeping backward through the search region. A back side profile could be obtained selectively, where, for instance, a front side profile does not provide coordinated starting points at all, or provides only costly coordinated starting points. A sample backside profile is shown in FIG. 3D for obstacle 210. Taking the profiles of FIGS. 3B and 3D together, slice 350 has two gaps—one on either side of obstacle 210. A central location can be positioned in the gap on the back side of obstacle 210. As shown in FIG. 3E, the traces straddle obstacle 210.

Figure 4:
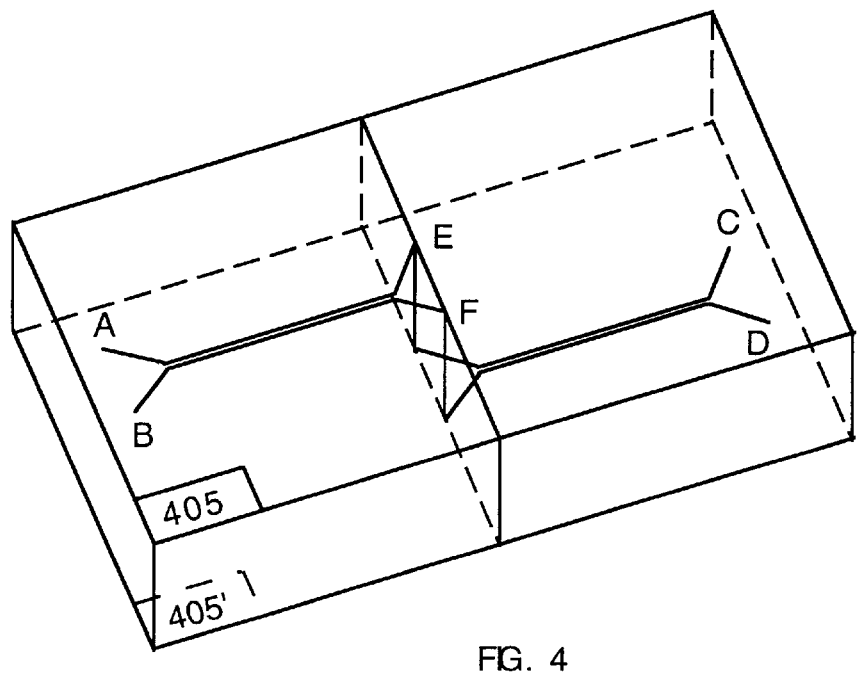
FIG. 4 is a diagram of a differential pair traversing two layers of a printed circuit board using a via.

FIG. 4 is a diagram of a differential pair traversing two layers, 405 and 405', of a PCB. A via, comprising endpoints E and F, is used to jump from one layer to another. Endpoints E and F are electrically coupled to both layers 405 and 405' of the PCB. Coordinated starting points at both ends of the differential pair, and on both sides of the via, can be positioned as discussed above.

In alternate embodiments, traces of a differential pair can be routed in parallel on two adjacent layers, rather than one layer. Those skilled in the art will recognize that the teachings of the present invention can be applied to adjacent layer differential pairs. For instance, a separate search region on each layer can be used, and the coordinated starting points can be overlaid.

Once coordinated starting points are located by system 500, any number of routing mechanisms could be used to route the rest of the differential pair. The locations of the coordinated starting points are, however, merely a best guess, based on the costing analyses. The layout of the components on the PCB may not permit the differential pair to be routed, or the routing may be very costly, from a first selected pair of coordinated starting points. In which case, system 500 can be called upon a second time, after eliminating the first pair of coordinated starting points as an option, to select a second pair of coordinated starting points.

Figure 6:
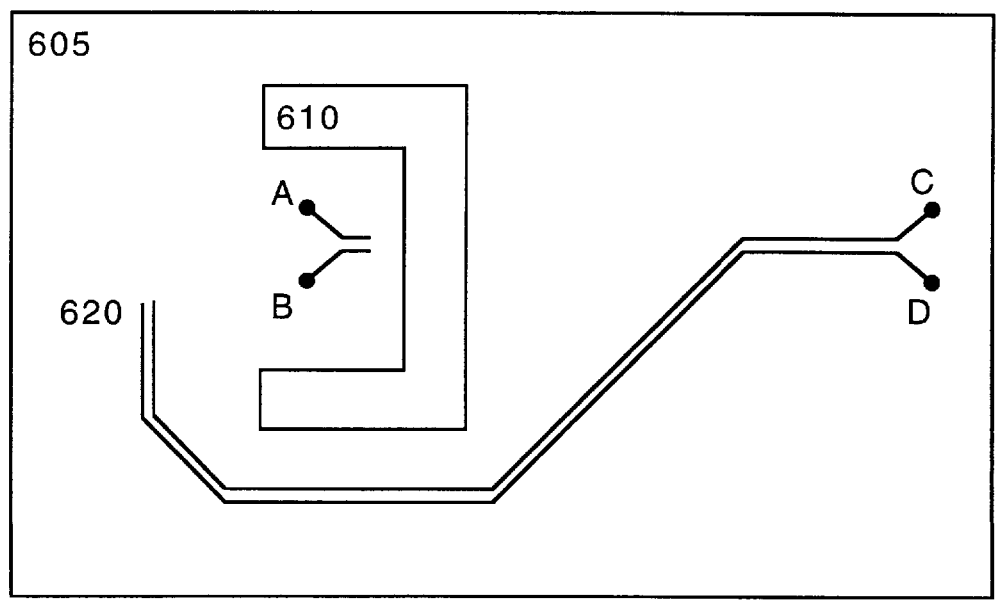
FIG. 6 is an example situation in which the system of FIG. 5 may be called upon twice.

FIG. 6 illustrates an example. When system 500 was first called upon, the search region for endpoints A and B was not large enough to include obstacle 610 on PCB 605. As a result, what was assumed to be the most direct route from endpoints A and B to endpoints C and D would require EDA system 505 to backtrack, or wrong-way route, the differential pair. In other words, the differential pair routed from endpoints A and B would have to loop around in order to escape obstacle 610. Wrong-way routing is costly and wasteful, so EDA system 505 is likely to try other approaches first. EDA system 505 could call system 500 again, and increase the size of the search region so that obstacle 610 is included. System 500 would try extending the search region in different directions, and on different layers of PCB 605, starting from the next most direct route. Eventually system 500 should locate coordinated starting points that will allow the differential pair to escape around obstacle 610. Since the search region will have to extend away from endpoints C and D to get around obstacle 610, though, system 500 is likely to sweep a number of search regions before finding one that will provide an escape.

Sweeping numerous search regions to find an escape from endpoints A and B is not a trivial operation. Computation time may be better spent elsewhere. For instance, EDA 505 may alternately try to start routing from a pair of coordinated starting points at endpoints C and D. In the illustrated example, routing from endpoints C and D allows the differential pair to be routed fairly close to endpoints A and B. The coordinated starting points for endpoints A and B, to which EDA system 505 will attempt to connect, are located on the wrong side of endpoints A and B, though. Routing to the coordinated starting points on the wrong side of endpoints A and B would again require wrong-way routing. In this situation, EDA system 505 can designate a termination 620 for the differential pair. Then, EDA system 505 can call upon system 500 again, specifying the location of termination 620 as the new destination for the differential pair being routed from endpoints A and B. System 500, then, will extend the search region in the direction of termination 620, and a second pair of coordinated starting points will be positioned that allow the connection to be completed.

Figure 7:
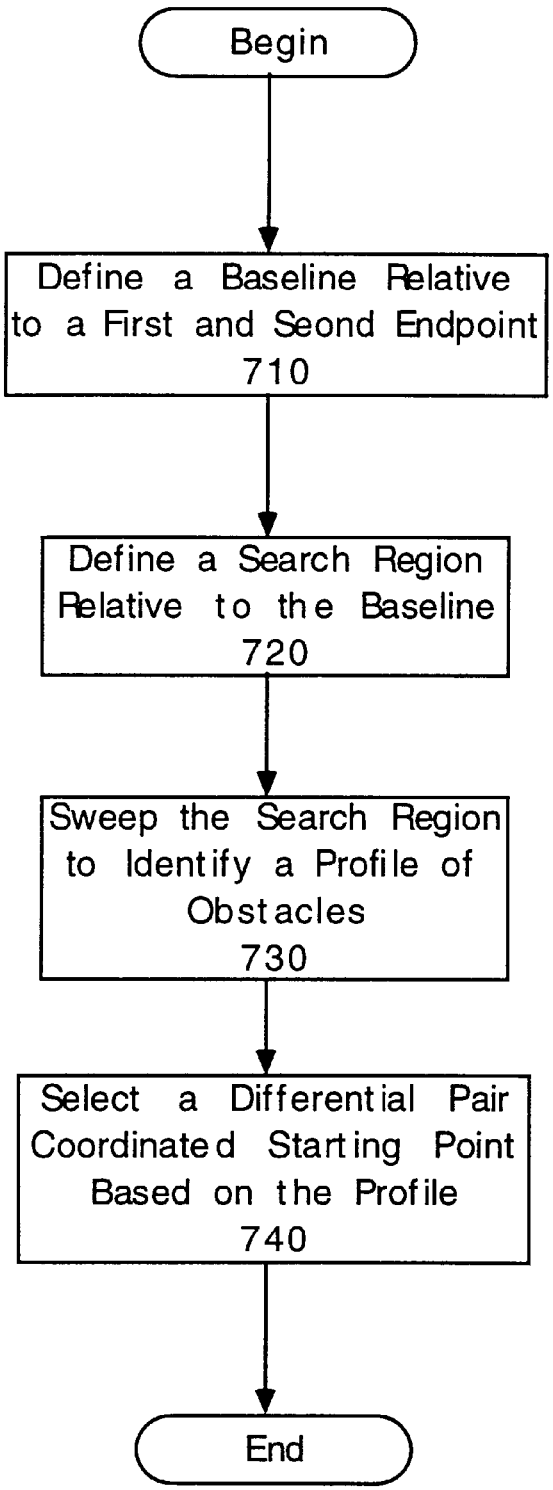
FIG. 7 is a flow chart of the process of one embodiment of the present invention.

FIG. 7 is a flow chart representing the steps of one embodiment of the present invention. First baseline finder 510 defines a baseline relative to first and second endpoints in block 710. In block 720, search region finder 515 defines a search region relative to the baseline. In block 730, sweeper 520 sweeps the search region to identify a profile of obstacles in the search region. Then, selector 525 selects coordinated starting points based on the profile in block 740.

Figure 8:
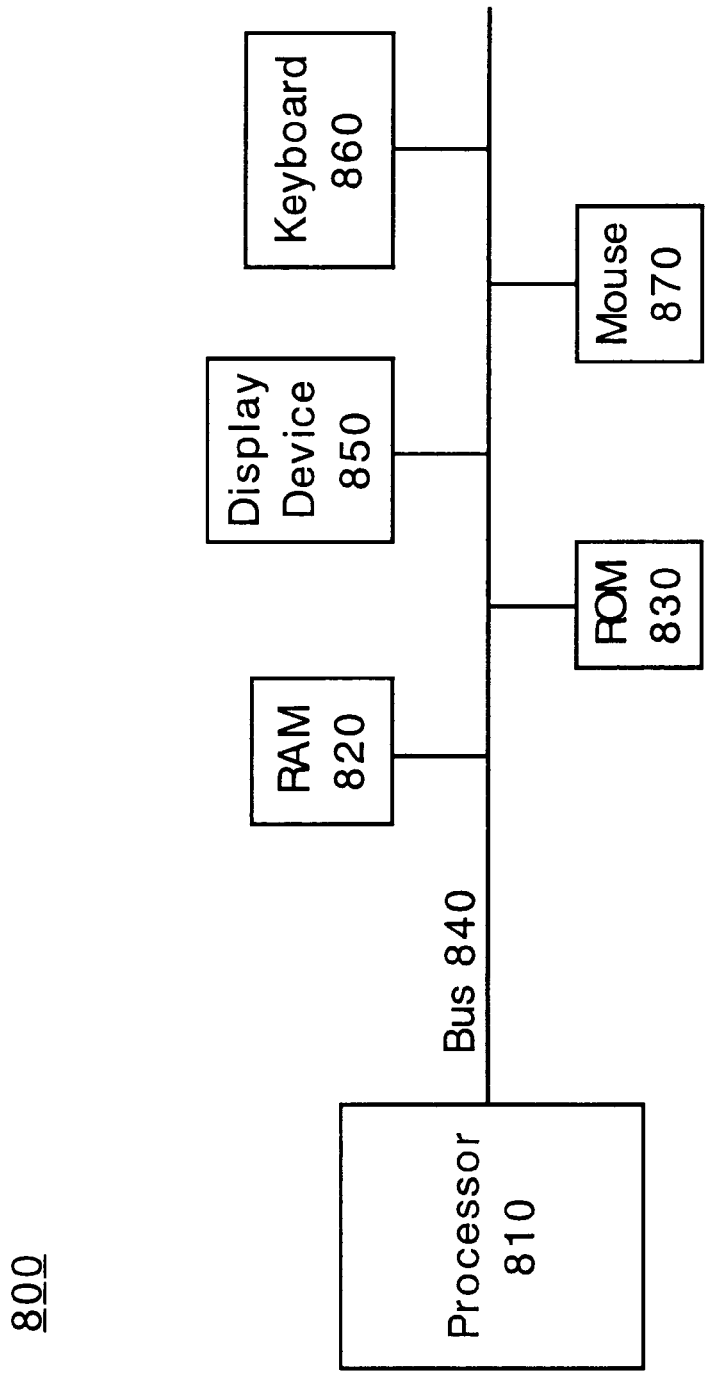
FIG. 8 is a block diagram of a computer system in which one embodiment of the present invention may be employed.

FIG. 8 is intended to represent a broad category of computer systems including, but not limited to, those based on the Pentium® processor, Pentium® Pro processor, or Pentium® II processor manufactured by and commonly available from Intel Corporation of Santa Clara, Calif., or the Alpha® processor manufactured by Digital Equipment Corporation of Manard, Mass. In FIG. 8, processor 810 includes one or more microprocessors. Processor 810 is coupled to random access memory (RAM) 820 and read only memory (ROM) 830 by bus 840. Input/Output devices, including display device 850, keyboard 860, and mouse 870, are also coupled to bus 840. A number of additional components can be coupled to bus 840 including, but not limited to, a bus bridge to another bus, an internet interface, additional audio/video interfaces, additional memory units, and additional processor units.

System 500 and EDA 505, as shown in FIG. 5, can be executed by processor 810 as a series or sequence of instructions or function calls stored in ROM 830 or RAM 820. Alternately, one or more ASICs (application specific integrated circuits) could be endowed with some or all of the functionality of system 500 and EDA 505, and inserted into system 800 as separate components, or combined with one or more other components.

Thus, an improved method and apparatus for automatically locating coordinated starting points is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:
    receiving data that defines at least part of a physical circuit design including a pair of endpoints comprising one end of a differential pair of traces, said differential pair of traces to be routed from the pair of endpoints, said pair of endpoints comprising a first endpoint for a first trace of the differential pair of traces and a second endpoint for a second trace of the differential pair of traces;
    dynamically constructing a profile of obstacles proximately situated adjacent to the pair of endpoints in the physical circuit design based on the received data; and
    determining a pair of coordinated starting points, based on the constructed profile, from which the differential pair of traces can be further routed in the physical circuit design in a coordinated manner, said coordinated starting points corresponding to the first and second endpoints.

2. The method of claim 1, wherein constructing the profile comprises:

defining a first baseline relative to the first and second endpoints;

defining a first search region relative to the first baseline; and sweeping the first search region to identify obstacles in the first search region.

3. The method of claim 2, wherein defining the first baseline comprises applying a costing analysis by which the first baseline is rotated such that the first search region extends from the first baseline in a direction of estimated least cost of the differential pair.

4. The method of claim 2, wherein defining the first baseline comprises rotating the first baseline to one of eight cardinal directions in a coordinate system associated with the physical circuit design.

5. The method of claim 2, wherein sweeping the first search region comprises indicating a first plurality of distances relative to the first baseline to a front surface of obstacles in the first search region, and/or a second plurality of distances relative to the first baseline to a back surface of the obstacles in the first search region.

6. The method of claim 5, wherein indicating the first and/or second plurality of distances comprises exaggerating dimensions of the obstacles in the first search region to allow for a spacing requirement between the obstacles and traces.

7. The method of claim 2 wherein, if the pair of coordinated starting points are not determined in the first search region, constructing the profile further comprises:

defining a second baseline relative to the first and second endpoints;

defining a second search region relative to the second baseline; and sweeping the second search region to identify obstacles in the second search region.

8. The method of claim 7 wherein defining the second baseline comprises applying a costing analysis by which the second baseline is rotated such that the second search region extends from the second baseline in a direction of estimated second least cost of the differential pair.

9. The method of claim 1, wherein determining the pair of coordinated starting points comprises determining a first path through the profile of obstacles from the first endpoint to a first coordinated starting point of the pair of coordinated starting points, and determining a second path through the profile of obstacles from the second endpoint to a second coordinated starting point of the pair of coordinated starting points.

10. The method of claim 1, wherein determining the pair of coordinated starting points comprises dividing the profile of obstacles into slices, each slice defined by an edge of a particular obstacle in the profile, and each slice divided into occupied regions and gaps, wherein each gap is compared to a minimum spacing requirement needed for the coordinated starting points.

11. The method of claim 1, wherein determining the pair of coordinated starting points comprises applying a costing analysis by which the pair of coordinated starting points are selecting at a pair of points of estimated least cost for the differential pair.

12. An apparatus comprising:

a profile finder to receive data that defines at least part of a physical circuit design including a pair of endpoints comprising one end of a differential pair of traces, said differential pair of traces to be routed from the pair of endpoints, said pair of endpoints comprising a first endpoint for a first trace of the differential pair of traces and a second endpoint for a second trace of the differential pair of traces, said profile finder to dynamically construct a profile of obstacles proximately situated adjacent to the pair of endpoints in the physical circuit design based on the received data; and a selector to determine a pair of coordinated starting points, based on the constructed profile, from which the differential pair of traces can be further routed in the physical circuit design in a coordinated manner, said coordinated starting points corresponding to the first and second endpoints.

13. The apparatus of 12, wherein the profile finder comprises:

a baseline finder to define a baseline relative to the first and second endpoints;

a search region finder to define a search region relative to the baseline; and a sweeper to sweep the search region to identify obstacles in the search region.

14. The apparatus of claim 13, wherein the profile finder further includes a costing analyzer by which the baseline and the corresponding search region are rotated such that the search region extends from the baseline line in a direction of estimated least cost of the differential pair.

15. The apparatus of claim 13, wherein the baseline is rotated to align with one of eight cardinal directions in a coordinate system associated with the physical circuit design.

16. The apparatus of claim 13, wherein the profile indicates a first plurality of distances relative to the baseline to a front surface of obstacles in the search region, and/or a second plurality of distances relative to the baseline to a back surface of obstacles in the search region.

17. The apparatus of claim 16, wherein dimensions of obstacles in the search region are exaggerated to allow for a spacing requirement between obstacles and traces.

18. The apparatus of claim 13 wherein, if the pair of coordinated starting points are not determined in the first search region, the baseline finder is to define a second baseline relative to the first and second endpoints, the search region finder is to define a second search region relative to the second baseline, and the sweeper is to sweep the second search region to identify obstacles in the second search region.

19. The apparatus of claim 18 wherein the profile finder includes a costing analyzer by which the second baseline and the corresponding second search region are rotated such that the second search region extends from the second baseline in a direction of estimated second least cost of the differential pair.

20. The apparatus of claim 12, wherein a first path exists through the profile of obstacles from the first endpoint to a first coordinated starting point of the pair of coordinated starting points, and a second path exists through the profile of obstacles from the second endpoint to a second coordinated starting point of the pair of coordinated starting points.

21. The apparatus of claim 12, wherein the profile is divided into slices, each slice is defined by an edge of a particular obstacle in the profile of obstacles, and each slice is divided into occupied regions and gaps, wherein each gap is compared to a minimum spacing requirement needed for the pair of coordinated starting points.

22. The apparatus of claim 12, wherein the selector includes a costing analysis by which the pair of coordinated starting points are selected at a pair of points of estimated least cost for the differential pair.

23. A machine-readable storage medium having stored thereon a plurality of programming instructions, execution of the plurality of programming instructions implements the method of:

receiving data that defines at least part of a physical circuit design including a pair of endpoints comprising one end of a differential pair of traces, said differential pair of traces to be routed from the pair of endpoints, said pair of endpoints comprising a first endpoint for a first trace of the differential pair of traces and a second endpoint for a second trace of the differential pair of traces;

dynamically constructing a profile of obstacles proximately situated adjacent to the pair of endpoints in the physical circuit design based on the received data; and determining a pair of coordinated starting points, based on the constructed profile, from which the differential pair of traces can be further routed in the physical circuit design in a coordinated manner, said coordinated starting points corresponding to the first and second endpoints.

24. The machine-readable storage medium of claim 23, wherein constructing the profile comprises:

defining a baseline relative to the first and second endpoints;

defining a search region relative to the baseline; and sweeping the search region to identify obstacles in the search region.

25. The machine-readable storage medium of claim 23, wherein determining the pair of coordinated starting points comprises determining a first path through the profile of obstacles from the first endpoint to a first coordinated starting point of the pair of coordinated starting points, and determining a second path through the profile of obstacles from the second endpoint to a second coordinated starting point of the pair of coordinated starting points.

26. The machine-readable storage medium of claim 23, wherein determining the pair of coordinated starting points comprises dividing the profile of obstacles into slices, each slice defined by an edge of a particular obstacle in the profile, and each slice divided into occupied regions and gaps, wherein each gap is compared to a minimum spacing requirement needed for the coordinated starting points.

27. The machine-readable storage medium of claim 23, wherein determining the pair of coordinated starting points comprises applying a costing analysis by which the pair of coordinated starting points are selecting at a pair of points of estimated least cost for the differential pair.

* * * * *